United States Patent
Koljonen et al.

(10) Patent No.: US 6,567,542 B1
(45) Date of Patent: *May 20, 2003

(54) AUTOMATIC TRAINING OF INSPECTION SITES FOR PASTE INSPECTION BY USING SAMPLE PADS

(75) Inventors: Juha Koljonen, Needham, MA (US); Leonid Taycher, Brighton, MA (US)

(73) Assignee: Cognex Technology and Investment Corporation, Mountain View, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/436,355

(22) Filed: Nov. 9, 1999

Related U.S. Application Data

(60) Provisional application No. 60/112,603, filed on Dec. 17, 1998.

(51) Int. Cl.[7] .................................................. G06K 9/00
(52) U.S. Cl. ........................................ 382/147; 382/151
(58) Field of Search ................................. 382/144, 145, 382/141, 151, 160, 147, 155; 706/48; 348/126, 87

(56) References Cited

U.S. PATENT DOCUMENTS

| 5,742,037 A | | 4/1998 | Scola et al. |
| 5,757,956 A | * | 5/1998 | Koljonen et al. ............ 382/151 |
| 5,912,984 A | | 6/1999 | Michael |
| 5,949,905 A | * | 9/1999 | Nichani et al. ............. 382/173 |
| 5,982,927 A | | 11/1999 | Koljonen |
| 6,269,179 B1 | * | 7/2001 | Vachtsevanos et al. ...... 382/149 |
| 6,317,513 B2 | * | 11/2001 | Michael et al. ............. 382/145 |

* cited by examiner

*Primary Examiner*—Amelia M. Au
*Assistant Examiner*—Virginia Kibler
(74) *Attorney, Agent, or Firm*—Russ Weinzimmer

(57) ABSTRACT

A method involves training a system to identify inspection sites on a printed circuit board. The method uses a priori information, which includes a sample pad description. A training region of interest is created within an image of the printed circuit board. A search tool is run to find pad candidates within the training region. The pad candidates are filtered and false pad candidates are eliminated. The filtered pad candidates are averaged to provide an average, and are modified based on the average.

12 Claims, 4 Drawing Sheets

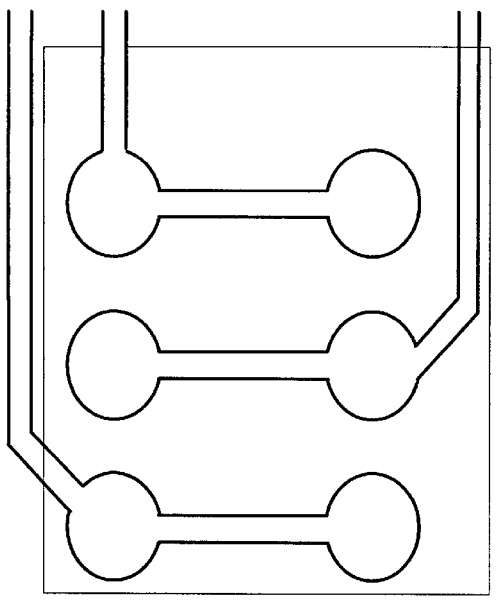
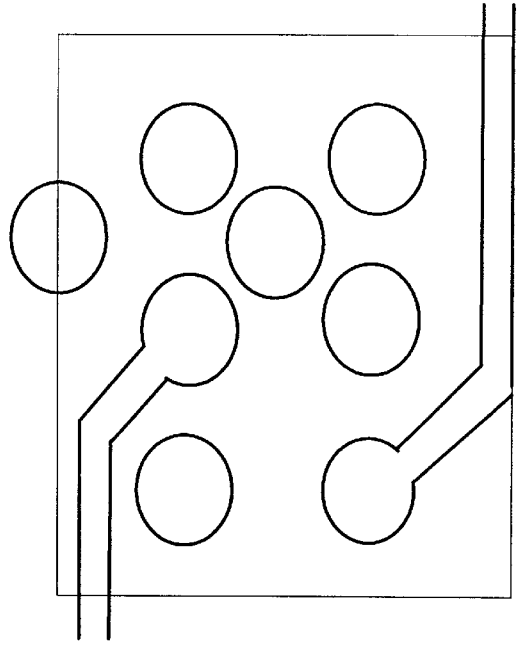
Figure 2B                               Figure 2C
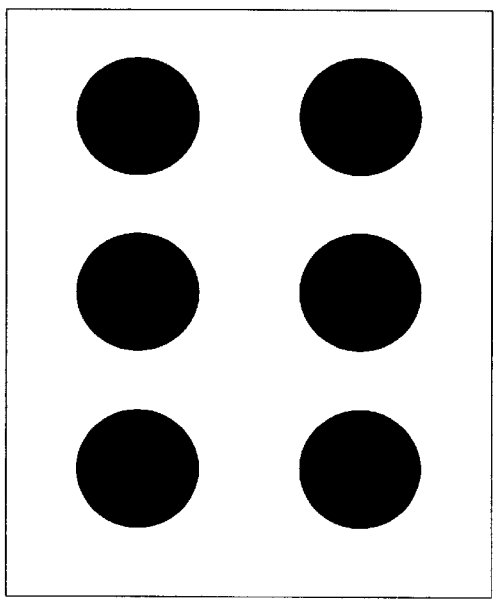
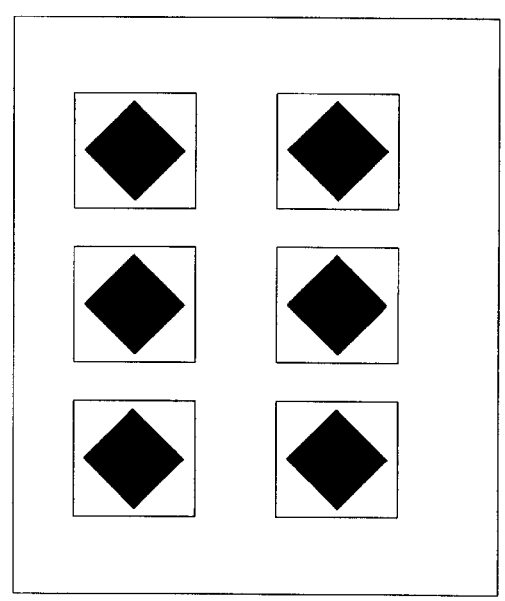
Figure 3A                               Figure 3B

AUTOMATIC TRAINING OF INSPECTION SITES FOR PASTE INSPECTION BY USING SAMPLE PADS

This application claims the benefit of priority from U.S. Provisional Patent Application No. 60/112,603, filed in the names of Juha Koijonen and Leonid Taycher, on Dec. 17, 1998.

BACKGROUND OF THE INVENTION

1. Field of the Invention

The present invention relates to machine vision and automated inspection systems, and more particularly to a method and apparatus for inspection of a solder paste screen printed on printed circuit boards using a stencil.

2. Description of Background Information

One method of assembling printed circuit boards (PCBs) requires solder paste to be applied to the printed circuit board before components, such as integrated circuits and discrete devices, are placed and ultimately secured onto the board. Initially, the stick solder paste temporarily holds the components in place on the PCB until the solder paste is melted or re-flowed. When the solder paste is re-flowed, it forms both mechanical and electrical connections between the components and the board. If there is not enough solder paste present, components may be inadequately connected to the PCB. If there is too much solder paste, or if solder paste is deposited in the wrong place, an extra electrical connection or short is formed. This is generally referred to as a solder bridge.

Automated processes for fabricating PCBs are generally known, including process steps for applying solder paste printed to circuit boards using screen-printing techniques. Prior to printing, a thin metal stencil or template is constructed with openings or apertures matching appropriate places on the PCB where paste should be printed; typically bond pads. During printing, the stencil is aligned to the PCB. The solder paste is then applied to the PCB through the stencil openings by using a squeegee to spread the paste. Then the stencil is lifted off the PCB and the PCB is transported to the next step in the assembly process.

Automatic inspection or vision systems may be used to detect problems in the printing process, including problems associated with the stencil and problems associated with the application of paste to the PCB. Stencil problems are usually in the form of blocked stencils or paste adhering to the bottom of the stencil (smear). It is usually desirable to detect stencil blockage and smear before any clean circuit boards are misprinted. Misalignment of the stencil and PCB may be detectable prior to the distribution of solder paste by inspection of the stencil position relative to the PCB before printing thereon. The PCB can be inspected to detect incorrect solder paste distribution after printing. Automatic inspection may be used to determine if there is too little solder paste, too much solder paste or solder paste in the wrong places on the printed circuit board.

The automated inspection of solder paste on PCBs is inherently difficult to accomplish. The solder paste is difficult to identify on the PCB because it is variable in terms of its appearance as imaged by the imaging system. The paste appearance varies over time, e.g., wet paste has a different appearance than dry paste. The paste has texture and the gray level reflectance of the paste is similar to bonding pads with tinning and other circuitry on the PCB. Also, the three-dimensional shape of the paste causes shadowing and other variable imaging as the paste moves under the lighting. The inherent difficulty is exacerbated by variability from one PCB to the next. For example, the color of circuit boards of a single type in one printing can vary from light green to dark green or blue. In one printing run, the relative positioning of portions or all of a PCB of a single board type may vary with respect to the stencil or solder mask on the board. Additionally, all of the circuitry on a board is subject to dimensional variability. The solder paste deposited on a board can obscure bond pads beneath it making it impossible to tell either what is beneath the solder paste or what is the relative alignment of the solder paste to the pads.

Known in-line or automated inspection systems for solder paste inspection do not adequately overcome such difficulties. Some known systems typically perform inspection by selecting gray level thresholds to segment paste from other regions by gray level. This is typically known as binarization (for two gray levels) or trinarization (for three gray levels). All pixels with gray levels between two thresholds are labeled as paste because the pads are usually the brightest objects in the image and boards are the darkest. The paste gray levels are typically somewhere in the middle.

To accomplish the above inspection, one distinguishes between the pads and other regions of the circuit board. Similarly, on the stencil, one needs to locate the aperture regions. To do this, one common mode of operation is to generate a model or parametric description of an inspection site. The purpose of this model is to be able to find pads and apertures at inspection time. This model is typically created by analyzing a representative image of a clean circuit board and stencil.

SUMMARY

A method is provided for training a system to identify inspection sites on a printed circuit board. The method includes using a priori information, including a sample pad description, which describes a shape and a size of each pad on the printed circuit board, to create a training region of interest within an image of the printed circuit board. A search tool is run to locate pad candidates. The pad candidates are filtered to eliminate false pad candidates. The filtered pad candidates are averaged and modified, with respect to a respective size and a respective position, based on the averaging.

Terminology

Inspection site—This is a region of the circuit board and/or the stencil that is chosen for inspection. Typically, an inspection site contains a number of bonding pads and/or stencil apertures. The magnification and resolution of the optical system determine the size of the site as imaged by the acquisition system.

Printing—Refers to the printing of solder paste on a circuit board. Pre-print refers to the point in the time in the printing cycle before printing where the circuit board is clean and free of solder paste. Post-print refers to the point in time after printing.

Training—This refers to the process of producing a model or description of an inspection site. This may be done by the operator defining a region of interest in the image and then analyzing that image, where the region of interest can be apertures on the stencil or pads on the circuit board, for example. The model may comprise a parametric geometric model that contains terms from which a geometric representation can be constructed. For instance, a parametric model of part of a circuit board having three rectangular pads may be $\{w_{pcb}, h_{pcb}, <loc_1, w_1, h_1>,$ <loc$_2$, w$_2$, h$_2$>, <loc$_3$, w$_3$, h$_3$>}, where w$_{pcb}$ and h$_{pcb}$ are the width and height of the PCB of the inspection site respectively, loc$_n$ is the location of the n$^{th}$ pad, and w$_n$ and h$_n$ is the width and height of the n$^{th}$ pad. A parametric model is advantageous over an image model because it requires less stored data, and because it focuses on regions of interest, such as pads, and, therefore, de-emphasizes extraneous features in the image which could otherwise confuse the method.

Inspection sites, printing, and training are further described in U.S. Pat. No. 5,912,984, titled "Method and Apparatus for In-Line Solder Paste Inspection", issued on Jun. 15, 1999, in the names of D. Michael, J. Koljonen, S. Nichani, and P. Roberts.

BRIEF DESCRIPTION OF THE DRAWINGS

The invention is described with reference to the following drawings in which:

FIGS. 2A–2C show a printed circuit board having pad candidates modeled by circular and rectangular shapes;

FIGS. 3A and 3B show a stencil having aperture openings modeled by a circular shape (FIG. 2A) and a rectangular shape (FIG. 2B), respectively.

DETAILED DESCRIPTION OF THE INVENTION

Figure 1:
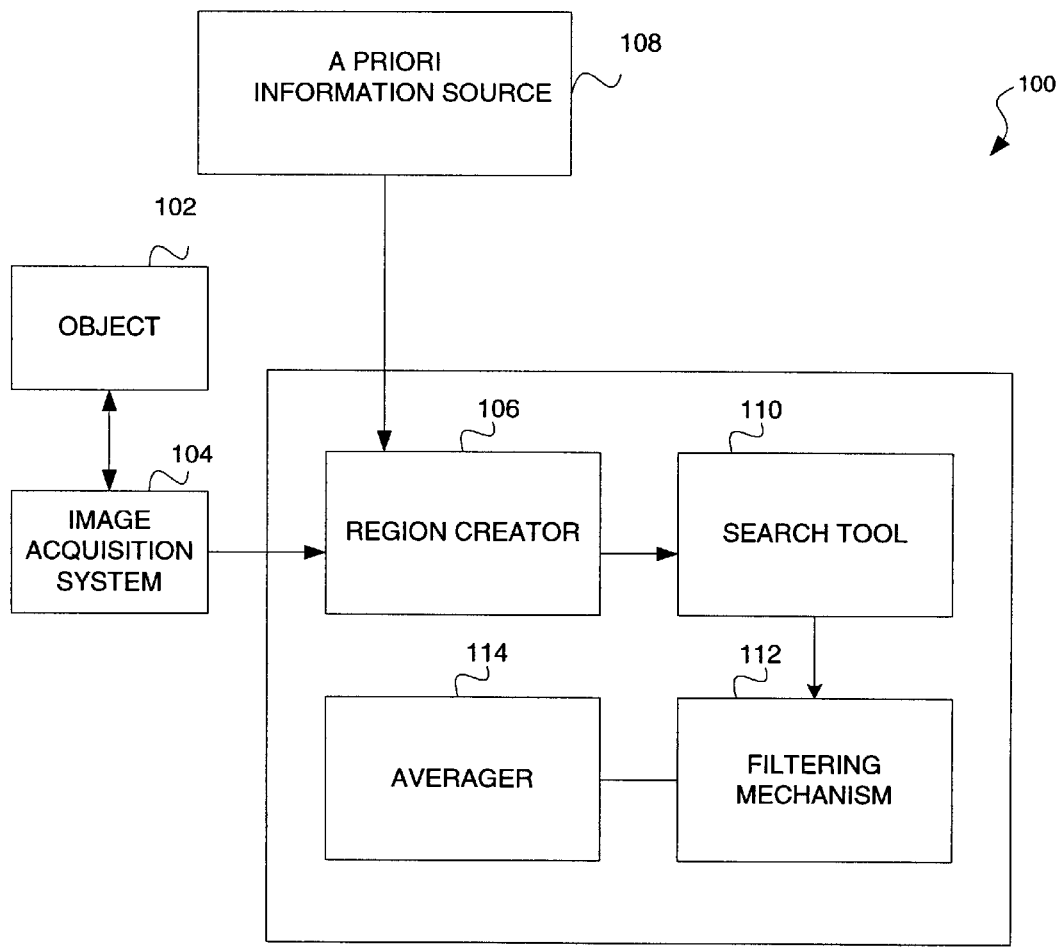
FIGS. 1 is a functional diagram for explaining the functioning of the invention.

An embodiment of the invention is explained with reference to FIG. 1, which shows an image acquisition system 104 obtaining an image of an object 102. The image acquisition system 104 send the image to image processing system 100 for processing. Image processing system 100 receives the image from image acquisition system 104 and receives a priori information from an a priori information source 108.

Image processing system 100 includes: a region creator 106, which receives the image and the a priori information; a search tool 110, uses region information and the a priori information, concerning nominal pad locations within the image, in order to locate pad candidates; a filtering mechanism 112, which eliminates false inspection site candidates; and an averager 114, for averaging and modifying the pad candidates with respect to size and position, based on an average.

The basic technique of the illustrated embodiment is primarily intended for training of circuit boards; however, stencils can also be trained with this method.

The illustrated method of circuit board training requires a priori information, which includes, for example, a pad description. The example pad description can be generated by numerous methods, such as an operator input or CAD information.

The goal of the training is to create almost exact pad descriptions within the site model. The description includes a parametric model having location information of each pad within the site and its corresponding size and shape. The training is done using the above a priori information and a search tool that uses this information in the following steps:

1) Create a region which includes the training region of interest.
2) Within each window, run a search tool, such as the PATMAX search tool, sold by Cognex Corporation, Natick, Mass. to locate pad candidates using the example pad description.
3) Filter the pad candidates to eliminate false accepts, confusion and features that are not pads.
4) Average and modify the pads found with respect to size and position.

The example pad description is used as a model. A size and a shape of the pads are known. The goal of the training is to find the locations of all the pads of the same size and shape in the image.

A vision tool such as the PATMAX search tool and the PATQUICK search tool (both of which are sold by Cognex Corporation of Natick, Mass.) can perform pattern recognition in the image. These tools can locate objects that appear different from the model in translation, scale and aspect ratio. PATMAX accurately locates objects by analyzing objects as geometric shapes as opposed to using pixel grids of gray values, as used by prior art systems. Alternately, other methods such as correlation search, as known in the art, can be used to find instances of the sample pad. In this case, the example pad description can be an image of a good pad, for example.

Although the models can be exactly the same shape as the pads, it is a recognition of an embodiment of the invention that rectangle and circle models approximate all current pads sufficiently for many applications. Even a problem, such as etching being improperly formed on sides of the pads can be addressed by the rectangular and circular models of the method.

Each application dictates the reasonableness of the model. However, rectangle and circle models allow the pad image sites to be located accurately enough to perform the next steps, such as registration, for instance.

Figure 2A:
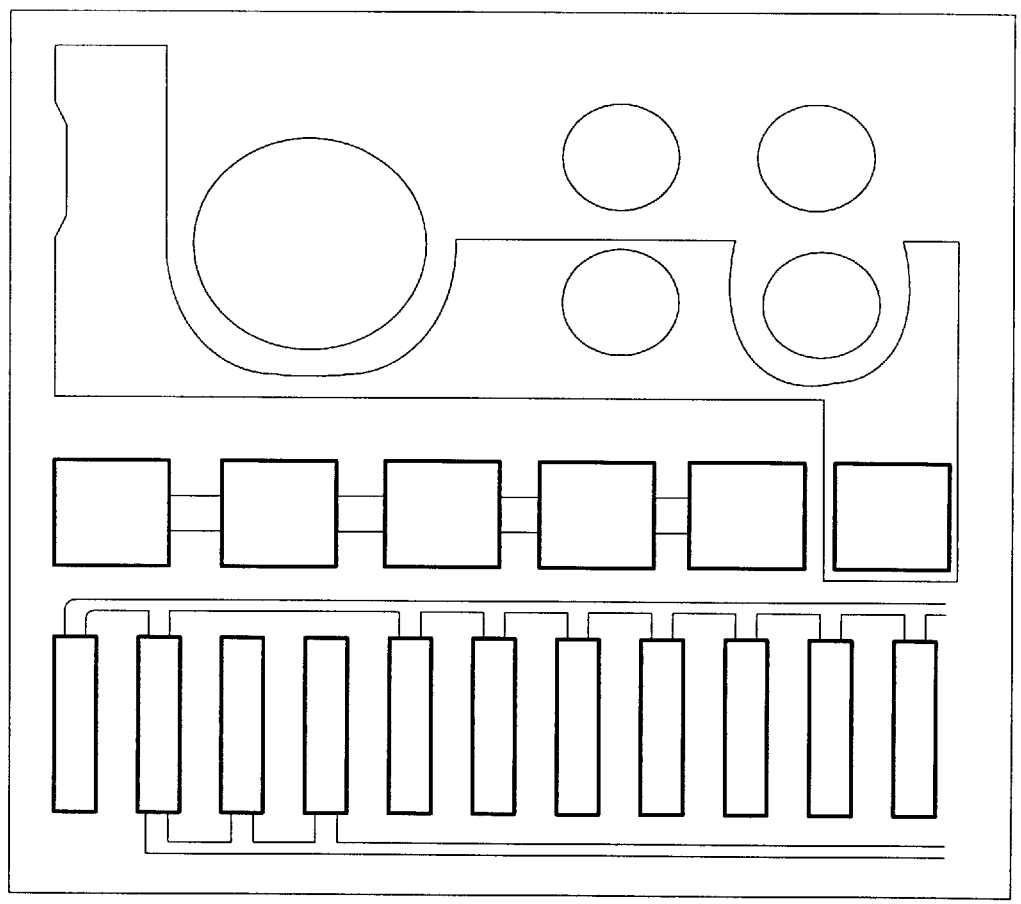

Several examples of pads that can be modeled using rectangles and circles are shown in FIGS. 2A–2C.

Several examples of apertures that can be modeled by using circles and rectangles are shown in FIGS. 3A–3B.

After the search tool, a filtering step is applied to weed out falsely found pads. The use of the above mentioned search tool is such that more pad candidates are generated than actual pads that exist. This is to ensure that all pads are found. The filtering is a process of elimination. The search method leans in the direction of favoring false accepts rather than false rejects because pads do not all exactly match the ideal pad in appearance. There is a chance that some pads are less likely to be found. Therefore, the sensitivity of the search tool is increased, which increases the likelihood of false accepts.

The filtering of multiple results is done by measuring features of the candidate pads. Each feature is scored using a metric and the scores are combined to generate a single pad candidate score which is then measured against an accept/reject threshold. This scoring method is a "fuzzy" scoring method in that feature scores can be combined in "fuzzy" ways where partial scores for features are allowed.

The features used in this implementation are:

standard deviation of gray level within the pad region—mean gray level within the pad as compared to all other found candidates;

search score;

strength of edges (i.e., magnitude of edges); and presence of edges on all sides.

Other features can be used as should be apparent after reading this disclosure.

To score one feature, such as standard deviation, the standard deviation of gray levels within the pad region is calculated. Pads typically appear as a single solid color. Confusing features could be circuit etches or feed through holes. Real pads would have a smaller standard deviation than confusing areas. In a normalized mapping scheme, the fuzzy scoring would map the raw standard deviation to a value from 0 to 1. A high standard deviation (i.e., above $S_{high}$) would map to 0 (because anything above $S_{high}$ can be assumed to not be a pad) and standard deviation below $S_{low}$ would map to 1. All values between $S_{high}$ and $S_{low}$ would map linearly to values between 0 and 1. The exact values of $S_{high}$ and $S_{low}$ will vary depending upon the application.

Mapping each feature raw score to a score from 0 to 1 normalizes all the scores into the same range so that they can be combined, and it also is the "fuzzy" element. A score does not have to indicate that a feature is either a pad feature or not. It can indicate a partial membership to a pad set. For example, a feature can be 0.5, which indicates that it may be a pad feature or it may not.

In one implementation, a candidate pad that scores well on all the above feature scores is accepted as a pad. In other words, for a given candidate pad, each feature score must be above a threshold value and the combination of all scores must be above a second threshold value.

In another implementation, a combination of scores is produced by taking a geometric mean. In this implementation, the raw scores are all normalized to the same scale range by mapping from the raw scores to scores that are in the range 0 to 1 as described above for standard deviation. Note that the user should define what is a good value for a score and what is a bad one for each application. This is driven by the nature and quality of the circuit board image.

The above scoring does not preclude the use of a simpler mechanism such as choosing a single feature for discrimination, or choosing the lowest feature score for comparison against an accept/reject score rather than combining scores.

Pads within a single quad flat pack (QFP) or ball grid array (BGA) part are typically all the same size and are spaced regularly. The act of averaging and modifying pad candidates takes this into account and averages the pad sizes and locations to come up with a more ideal inspection site description.

The above board training is primarily intended for use on circuit boards without the benefit of stencil information. The technique can be applied to train stencils as well.

Figure 4:
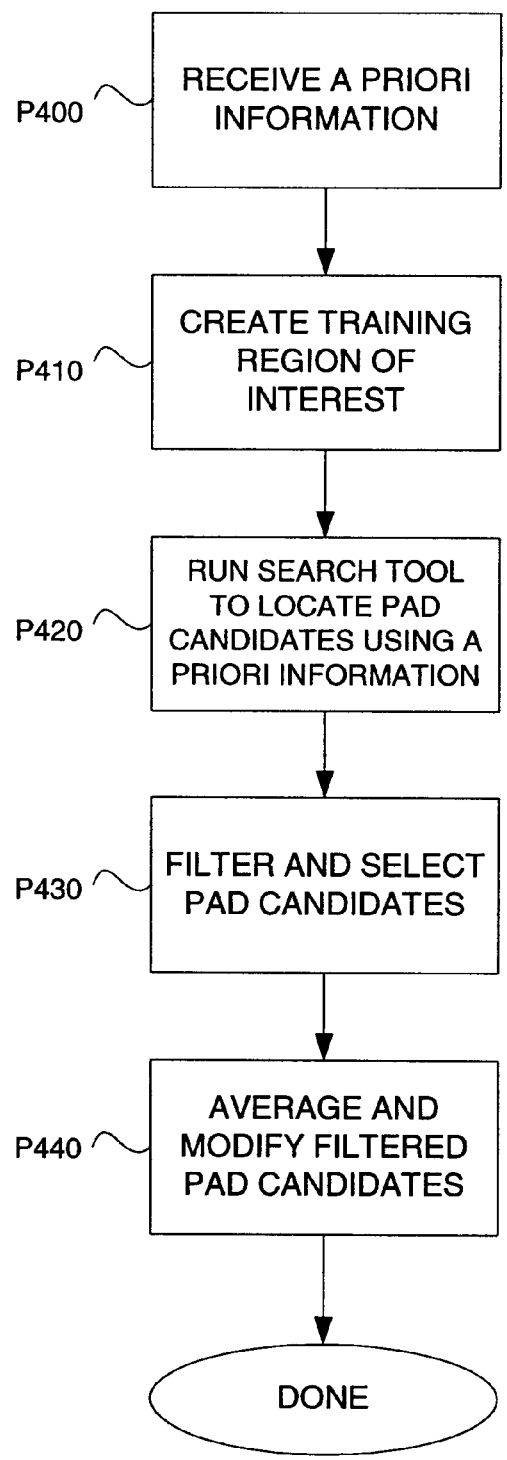
FIG. 4 is a flowchart which helps to explain the process of training the system to identify inspection sites.

FIG. 4 shows a flowchart which describes an example embodiment of the process. At P400, a priori information is received. The a priori information includes information, such as, for example, a sample pad description describing a shape and a size of each pad on the printed circuit board.

In P410, a training region of interest is created within an image of the printed circuit board.

In P420, a search tool is run to locate pad candidates. The search tool may be, for example, the PATMAX search tool or the PATQUICK search tool. Both search tools are sold by Cognex Corporation of Natick, Mass. Alternately, a correlation search, as it is well known in the art, may be run using a multitude of models of different sizes and shapes.

In P430, filtering is performed by measuring features of the pad candidates. Example measured features are as described previously. False pad candidates are eliminated as a result of the filtering.

In P440, the size and location of the pad candidates is averaged and modified based on the average. For example, a location of pad candidates may be averaged by determining the nominal locations of the pad candidates within a row or a column, averaging the same, and modifying the pad candidates based on the average. This provides a more ideal inspection site description because pads within a single quad flat pack (QFP) or ball grid array (BGA) part are typically all the same size and are regularly spaced.

Although the invention has been shown and described with respect to exemplary embodiments thereof, various other changes, omissions and additions in the form and detail thereof may be made therein without departing from the spirit and scope of the invention, such as the training of model refinement of other regions of interest similar to at least a portion of the various geometries of pads.

What is claimed is:

1. A method for training a system to identify inspection sites on a printed circuit board, comprising:

using a prior information, including a sample pad description describing a shape and a size of each pad on the printed circuit board, to create a training region of interest within an image of a printed circuit board;

running a search tool, using the sample pad description, on the image of the printed circuit board to locate pad candidates;

filtering the located pad candidates to eliminate false ones of the located pad candidates;

averaging, with respect to a respective size and a respective position to provide an average pad candidate size and an average pad candidate position; and modifying the filtered pad candidates, using the average pad candidate size and an average pad candidate position, to provide a modified pad candidate size and a modified candidate position.

2. The method according to claim 1, wherein the filtering comprises:

measuring at least one feature of the located pad candidates and assigning a respective score corresponding to each of the at least one measured feature;

combining the scores to generate a single located pad candidate score;

comparing the single located pad candidate score against an accept/reject threshold; and accepting, as a located pad, at least some of the located pad candidates based on the comparing.

3. The method according to claim 2, wherein the combining combines the scores in a fuzzy manner allowing partial scores to be associated with the at least one feature.

4. The method according to claim 2, wherein the at least one feature includes at least one of a search score, a standard deviation of gray levels within the training region of interest, a magnitude of edges, and a presence of edges on all sides.

5. The method according to claim 3, wherein each of the respective scores is normalized to a score in a range from 0 to 1, inclusive.

6. The method according to claim 1, wherein the filtering comprises:

measuring at least one feature of the located pad candidates and assigning a respective score corresponding to each of the at least one measured feature;

combining the scores to generate a single located pad candidate score;

accepting, as a located pad, ones of the located pad candidates having the respective score, associated with each of the at least one feature, being greater than a first accept/reject threshold and having a respective single located pad candidate score being greater than a second accept/reject threshold.

7. The method according to claim 1, wherein at least some of the a priori information is derived from known pad patterns based on design data.

8. The method according to claim 1, wherein the filtering comprises:
   measuring a standard deviation of gray level for each one of the located pad candidates; and
   eliminating ones of the located pad candidates having a respective standard deviation of gray level above a predetermined threshold.

9. The method according to claim 1, wherein the filtering comprises:
   measuring a standard deviation of gray level for each one of the located pad candidates;
   determining a mean standard deviation of gray level for a combined total of all of the located pad candidates;
   comparing the standard deviation of gray level for the each one of the located pad candidates with the mean standard deviation of gray level for the combined total of all of the located pad candidates; and
   eliminating a respective one of the located pad candidates based on the comparing.

10. The method according to claim 1, wherein:
    the filtering comprises:
       measuring at least one feature of the located pad candidates and assigning a respective score corresponding to each of the at least one measured feature, each of the respective scores being normalized to a score in a range of 0 to 1, inclusive, and
    the averaging and modifying comprises:
       performing a geometric mean of the respective scores.

11. The method according to claim 1, wherein the filtering comprises:
    measuring one feature of the located pad candidates and assigning a score corresponding to the one measured feature; and
    accepting, as a pad, at least some of the located pad candidates based on a respective score of the located pad candidates.

12. The method according to claim 1, wherein the filtering comprises:
    measuring at least one feature of the located pad candidates and assigning a respective score corresponding to each of the at least one measured feature; and
    accepting, as a located pad, ones of the located pad candidates having a lowest respective score, associated with the at least one feature, such that the lowest respective score is greater than an accept/reject threshold.

* * * * *

UNITED STATES PATENT AND TRADEMARK OFFICE
CERTIFICATE OF CORRECTION

PATENT NO.    : 6,567,542 B1
DATED         : May 20, 2003
INVENTOR(S)   : Koljonen et al.

It is certified that error appears in the above-identified patent and that said Letters Patent is hereby corrected as shown below:

<u>Column 6,</u>
Line 16, "using a prior information" should read -- using a priori information --

Signed and Sealed this

Eighth Day of July, 2003

JAMES E. ROGAN
*Director of the United States Patent and Trademark Office*